United States Patent
Lee

(10) Patent No.: US 7,223,675 B2
(45) Date of Patent: May 29, 2007

(54) METHOD OF FORMING PRE-METAL DIELECTRIC LAYER

(75) Inventor: Jae Suk Lee, Icheon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 109 days.

(21) Appl. No.: 11/126,900

(22) Filed: May 10, 2005

(65) Prior Publication Data

US 2005/0255681 A1    Nov. 17, 2005

(30) Foreign Application Priority Data

May 11, 2004    (KR) ...................... 10-2004-0033006

(51) Int. Cl.
*H01L 21/425*    (2006.01)
(52) U.S. Cl. .................... 438/514; 438/663; 438/680; 438/692; 257/E21.17; 257/E21.248; 257/E21.304; 257/E21.334
(58) Field of Classification Search ................ 438/514, 438/506, 509, 513, 680, 681, 663, 679, 692
See application file for complete search history.

(56) References Cited

U.S. PATENT DOCUMENTS 5,484,749 A * 1/1996 Maeda et al. ............... 438/788
5,814,377 A * 9/1998 Robles et al. ............... 427/579
6,009,827 A * 1/2000 Robles et al. ........... 118/723 R
6,013,584 A    1/2000 M'Saad
6,802,944 B2 * 10/2004 Ahmad et al. .......... 204/192.23
6,808,748 B2 * 10/2004 Kapoor et al. .......... 427/255.31
6,812,153 B2 * 11/2004 Hua et al. .................... 438/706
6,908,862 B2 * 6/2005 Li et al. ...................... 438/700
7,097,886 B2 * 8/2006 Moghadam et al. ......... 427/569

FOREIGN PATENT DOCUMENTS

KR    10-2002-0053561        8/2000

OTHER PUBLICATIONS

Inoue Akira; Manufacture of Semiconductor Device; Patent Abstracts of Japan; Aug. 4, 2000; Publication No. 2000216245 A; Japanese Patent Office; Japan.

* cited by examiner

*Primary Examiner*—David Nhu
(74) *Attorney, Agent, or Firm*—Andrew D. Fortney

(57) ABSTRACT

A method of forming a pre-metal dielectric (PMD) layer is disclosed. In the method, after a nitride liner layer is formed on a substrate having a transistor, a USG layer is deposited thereon and then planarized. Next, ion implantation and annealing are performed for gettering, first in a gate region and then in a non-gate region of the USG layer. The USG layer is generally free from plasma damage and has a good gap-fill capability. Further, ion implantation and annealing after deposition of the USG layer may enhance a gap-fill capability, a gettering capability, and electrical properties of a transistor.

18 Claims, 4 Drawing Sheets

METHOD OF FORMING PRE-METAL DIELECTRIC LAYER

CROSS REFERENCE TO RELATED APPLICATIONS

This U.S. non-provisional application claims priority under 35 U.S.C. §119 from Korean Patent Application No. 2004-33006, which was filed in the Korean Intellectual Property Office on May 11, 2004, the contents of which are incorporated by reference herein in its entirety.

BACKGROUND OF THE INVENTION

1. Field of the Invention

The present invention relates to a method of forming a pre-metal dielectric (PMD) layer and, more particularly, to forming a PMD layer using an undoped silica glass (USG), ion implantation, and annealing so as to enhance a gap-fill capability, a gettering capability, and electrical properties of a transistor.

2. Description of the Related Art

According to Moore's Law, the degree of integration on semiconductor devices doubles almost every two years. Chip size and design rules shrink accordingly, and new and unexpected problems to be solved are continuously introduced as a result.

The PMD layer is an insulating layer that is provided for separation between a polysilicon gate and an overlying metal layer. The PMD layer should have a good gap-fill capability, a good gettering capability, an easy reflow planarization, and a low moisture absorption.

The gap-fill capability is the ability to fill gaps between adjacent patterns of the semiconductor device. Further, the gettering capability is the ability to trap mobile ions, such as sodium or other metal ions that may degrade device properties.

Silicon oxide (e.g., $SiO_2$) is used often for insulating layers in the semiconductor industry. A silicon oxide PMD layer, however, may have a poor gap-fill capability when used to fill gaps produced by stepped surfaces of the polysilicon gates. Therefore, the silicon oxide PMD layer frequently creates unfavorable voids, by which the PMD layer is not densified and the device is degraded in quality and reliability. Moreover, the voids in the PMD layer may be filled with conductive material in subsequent deposition of conductive material for contacts. The conductive material in the voids may sometimes cause unexpected short circuits between the contacts. This is a serious cause of a drop in yield.

As an alternative to the silicon oxide PMD layer, BPSG (borophosphosilicate glass) or PSG (phosphosilicate glass) may be used for the PMD layer. The BPSG PMD layer may be formed by introducing boron and phosphorus sources into a processing chamber along with the silicon and oxygen sources that normally form a silicon oxide layer. Generally, boron doping enhances a gap-fill capability, and phosphorus increases a gettering capability.

Typically, the BPSG layer may be formed using CVD (chemical vapor deposition) techniques, for example, PECVD (plasma enhanced CVD), APCVD (atmospheric pressure CVD), SACVD (sub-atmospheric pressure CVD), and LPCVD (low pressure CVD). At design rule of about 0.5 μm, a $SiH_4$ BPSG layer is deposited and then reflowed at a temperature of about 900° C. At design rule less than 0.5 μm, an $O_3$ TEOS BPSG layer is deposited using APCVD or SACVD and then reflowed at a temperature ranging from 850° C. to 900° C.

However, at further smaller design rule, for example, less than 0.25 μm, a higher reflow temperature may deteriorate device characteristics. In addition, boron should be added at a specific concentration so as to adequately reflow the BPSG layer. However, above certain boron concentrations, the BPSG layer may often crystallize due to increased moisture absorption. Crystallization may cause or increase the incidence of cracks in the BPSG layer.

The BPSG PMD layer may be replaced by a PSG PMD layer that is formed using PECVD or APCVD. The PSG layer may have a good insulating property and a relatively low reflow temperature. The PSG layer, however, may not only have a high moisture absorption, but also have a high hydrogen and carbon content in the layer. Additionally, PECVD or APCVD process may often produce seams in the PSG layer. Such seams may be easily attacked by slurry during CMP (chemical mechanical polishing) process.

FIGS. 1A to 1C sequentially show a conventional method of forming the BPSG PMD layer.

As shown in FIG. 1A, a gate electrode 11 is formed on a semiconductor substrate 10, and then a nitride layer 12 is formed thereon.

Next, as shown in FIG. 1B, a BPSG layer 14 is deposited using a CVD technique, for example, PECVD, APCVD or SACVD at a temperature of 380° C. to 400° C. Unfavorable voids 13 that may be created in the BPSG layer 14 not only disturb densification of the BPSG layer 14, but may also receive conductive material causing defective devices.

Next, as shown in FIG. 1C, the BPSG layer 14 is reflowed through a heat treatment process. The heat treatment process is carried out in order to densify the BPSG layer 14 by removing the voids 13. For example, a rapid thermal process may be carried out for 20 seconds to 60 seconds at a temperature of 700° C. to 1100° C., or annealing may be performed in a furnace for 20 minutes to 60 minutes at a temperature of 700° C. to 1100° C.

The above-discussed conventional method of fabricating the PMD layer is favorable when used to fill gaps with aspect ratios less than about 5:1. However, since the aspect ratio increases with decreasing chip size, the gap-fill process becomes more difficult. So, the voids 13 in the BPSG layer 14 are not always completely removed after reflow with heat treatment.

In order to solve such problems, Korean Patent Registration No. 10-388205 discloses a method that includes forming a barrier on a silicon substrate having a gate, implanting fluorine ions into the barrier, diffusing the fluorine ions through a first heat treatment process, depositing a BPSG layer on the fluorine-diffused barrier, and reflowing the BPSG layer through a second heat treatment process. This method, however, may have limitations on improvements in gap-fill capability.

On the other hand, U.S. Pat. No. 6,013,584 discloses a method using a high density plasma (HDP) CVD technique when forming a PSG layer. This method includes introducing a process gas, such as $SiH_4$, $PH_3$, $O_2$, and argon, into a processing chamber, maintaining a temperature and a pressure of 400~650° C. and 1~10 mTorr, respectively, and applying high density plasma bias to a substrate. However, this method may have undesirable effects on electrical characteristics of a transistor due to damage that may be induced by the strong plasma.

SUMMARY OF THE INVENTION

The present invention provides a method of forming a pre-metal dielectric (PMD) layer by using an undoped silica glass (USG) layer, which is substantially free from plasma damage and has a good gap-fill capability.

According to one embodiment of the present invention, the method includes forming a nitride liner layer on a substrate having a transistor therein. The method also includes depositing the USG layer on the liner nitride layer and then planarizing the USG layer. In addition, the method includes performing a first ion implantation (e.g., for gettering) and a first annealing in a first selected region of the USG layer, and performing a second ion implantation (e.g., for gettering) and a second annealing in a second selected region of the USG layer, wherein one of the first and second regions corresponds to a gate region of the transistor.

The USG layer may comprise tetraethyl orthosilicate (TEOS), such as $O_3$ TEOS or atomic layer deposition (ALD) TEOS.

According to another embodiment of the present invention, the method may further include, before depositing the USG layer, implanting fluorine ions into the nitride liner layer and then heating.

In the method, the first and second ion implantations may comprise implanting nitrogen ions, phosphorus ions, or arsenic ions.

Furthermore, the first and second annealing may be performed in a furnace for 10 minutes to 80 minutes at a temperature of 600° C. to 1200° C. Alternatively, the first and second annealing may comprise rapid thermal processing for 10 seconds to 80 seconds at a temperature of 600° C. to 1200° C.

DETAILED DESCRIPTION OF EXEMPLARY EMBODIMENTS OF THE INVENTION

Figure 1A:
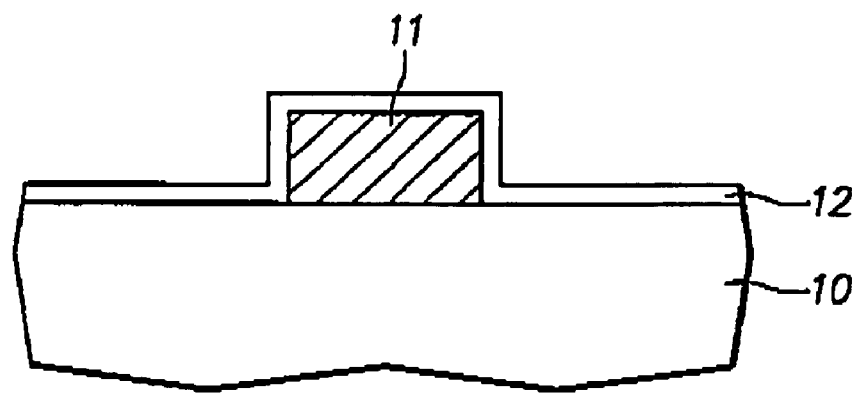
FIGS. 1A to 1C are cross-sectional views showing a conventional method of forming a PMD layer.
Figure 1B:
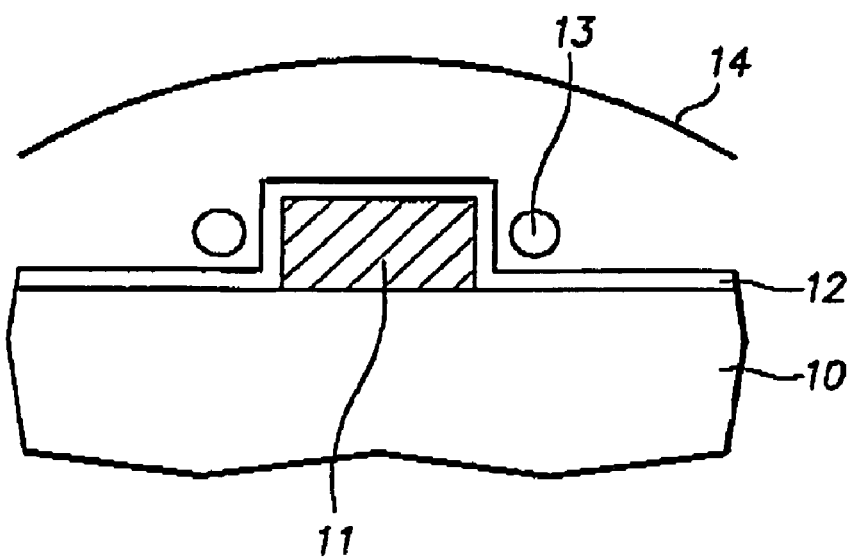
Figure 1C:
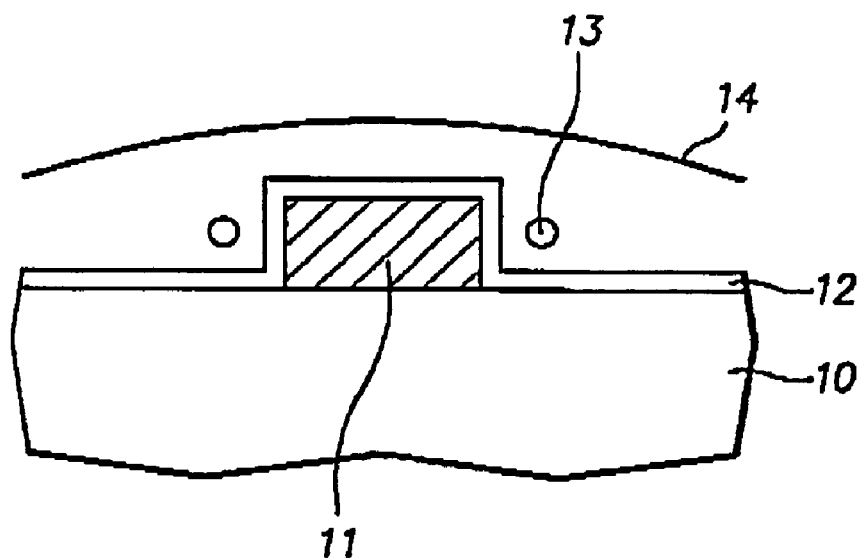

Exemplary, non-limiting embodiments of the present invention will now be described more fully hereinafter with reference to the accompanying drawings. This invention may, however, be embodied in many different forms and should not be construed as limited to the exemplary embodiments set forth herein. Rather, the disclosed embodiments are provided so that this disclosure will be thorough and complete, and will fully convey the scope of the invention to those skilled in the art. The principles and features of this invention may be employed in varied and numerous embodiments without departing from the scope of the invention.

In is noted that well-known structures and processes are not described or illustrated in detail to avoid obscuring the essence of the present invention. It is also noted that the figures are not drawn to scale. Rather, for simplicity and clarity of illustration, the dimensions of some of the elements are exaggerated relative to other elements. Like reference numerals are used for like and corresponding parts of the various drawings.

FIGS. 2A to 2D show, in cross-sectional views, a method of forming a PMD layer in accordance with an embodiment of the present invention.

Figure 2A:
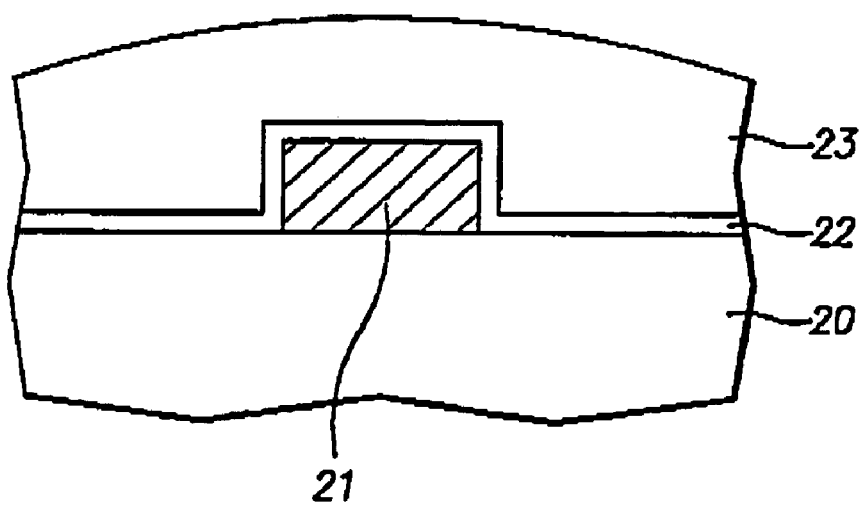
FIGS. 2A to 2D are cross-sectional views showing a method of forming a PMD layer in accordance with an embodiment of the present invention.

Referring to FIG. 2A, after a gate electrode 21 is formed on a semiconductor substrate 20, a nitride liner layer 22 is formed thereon. Then an $O_3$ (ozone)-TEOS (tetraethyl orthosilicate) USG layer 23 is deposited on the nitride liner layer 22. Although not depicted in the drawings, typical transistor elements such as a spacer dielectric (e.g., oxide and/or nitride), lightly doped drain (LDD) extensions and source/drain terminals are included under the nitride liner layer 22. The nitride liner layer 22 may also function as an etch stop layer, and may be formed using PECVD or LPCVD. The USG layer 23 may comprise TEOS (e.g., $O_3$ TEOS or ALD [atomic layer deposition] TEOS). The USG layer 23 is generally superior to BPSG layers in gap-fill capability, thus resulting in fewer voids.

Before the USG layer 23 is deposited, fluorine ions may be implanted into the nitride liner layer 22. The implanted fluorine ions generally reduce the viscosity of the USG layer 23, so the USG layer 23 may improve in a flow property when deposited or annealed (e.g., it may flow at a lower temperature, and/or its flow rate may be higher at a given temperature). Therefore, undesirable voids may be more easily removed from the USG layer 23. The fluorine ions may be implanted at energy ranging from 1 keV to 100 keV.

After the fluorine ion implantation, a heat treatment process (e.g., heating) may be carried out to diffuse the fluorine ions. This heat treatment process may employ, for example, furnace annealing for 20 minutes to 50 minutes at a temperature of 700° C. to 900° C., or rapid thermal processing for 20 seconds to 50 seconds at a temperature of 700° C. to 1000° C.

Figure 2B:
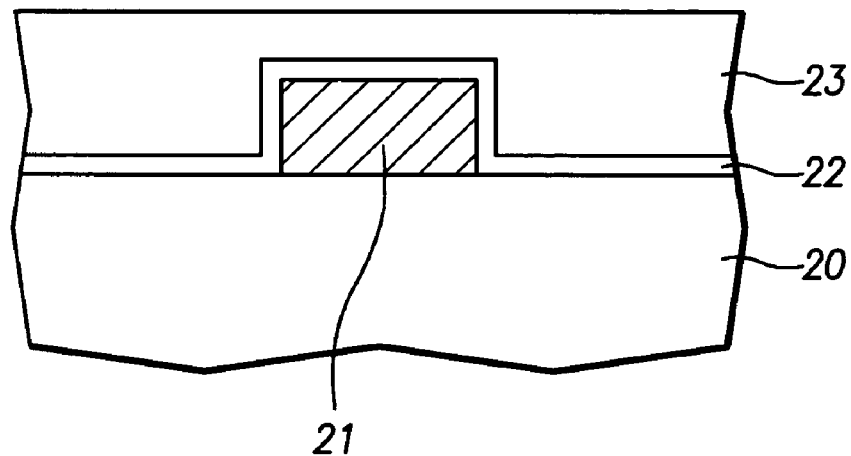

Next, as shown in FIG. 2B, the upper surface of USG layer 23 is planarized by chemical mechanical polishing (CMP), for example.

Figure 2C:
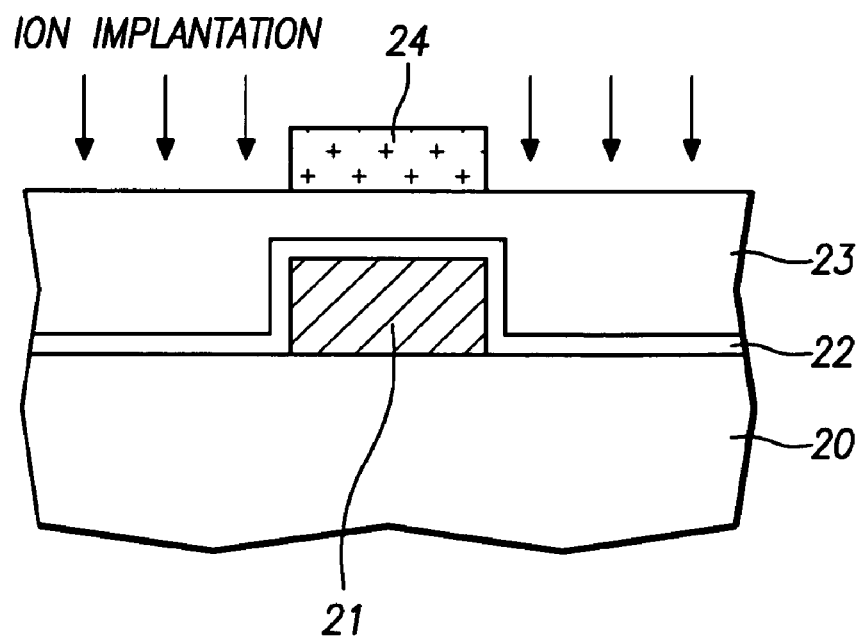

Thereafter, as shown in FIG. 2C, a suitable photoresist material is coated onto the planarized USG layer 23 and then selectively exposed and developed to leave a desired pattern. After a resultant photoresist pattern 24 substantially or completely covers the gate electrode 21, an ion implantation process is carried out (e.g., to enhance the gettering capability of the PMD layer). Thus, the photoresist pattern 24 may function as a mask for the ion implantation into non-gate regions or areas of the PMD. The implanted ions may comprise nitrogen ions, phosphorus ions, and/or arsenic ions. Further, in this implantation, process conditions such as ion energy, dose, and tilt angle may be controlled to increase a gap-fill capability of the PMD layer as well as the gettering capability. The photoresist pattern 24 is removed after the ion implantation, and then an annealing process is performed. As a result, any voids remaining in the USG layer 23 are substantially or completely removed during the annealing process, so a densified layer is obtained.

This annealing process not only restores or repairs any damage to the USG layer 23 due to ion implantation, but also helps to reduce or remove residual voids. This annealing process may be performed, for example, in a furnace for 10 minutes to 80 minutes at a temperature of 600° C. to 1200° C., or may comprise rapid thermal processing (also sometimes known as rapid thermal annealing, or RTA) for 10 seconds to 80 seconds at a temperature of 600° C. to 1200° C.

In an alternative case, such an annealing process may be performed before or while the photoresist pattern is removed. In this case, the photoresist pattern may be removed by oxidation during the annealing process.

Figure 2D:
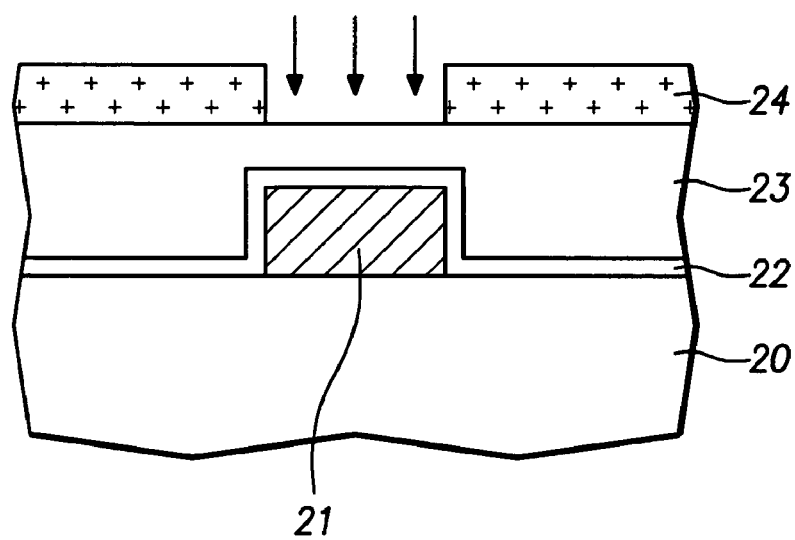

Next, as shown in FIG. 2D, another photoresist pattern 24 is provided on the TEOS USG layer 23, exposing a region above the gate electrode 21 and functioning as a mask for the non-gate regions or areas. Then the above-discussed ion implantation, photoresist pattern removal, and annealing are carried out again in sequence. The various ion implantation conditions, such as identity of the ion (e.g., phosphorous or a combination of boron and phosphorous), implant energy, dose or ion concentration, bias, and tilt angle may be the same or different. For example, the ion will generally be the same, but in some embodiments, the implant energy and/or dose will be higher when implanting in the non-gate areas, and the tilt angle may be zero in the non-gate areas and greater than zero in the gate areas.

As discussed hereinbefore, the present embodiment shown in FIGS. 2A to 2D includes a first ion implantation targeting a non-gate region and a second ion implantation targeting a gate region. This order may be changed. Also, the ion implantation targeting the gate regions may improve the PMD gettering capability, while the ion implantation targeting the non-gate regions improve the PMD gettering capability and, optionally, the PMD reflow capability.

The method for forming the PMD layer according to the present invention employs a USG layer that is substantially free from plasma damage and has a good gap-fill capability. Further, the method of the present invention includes performing ion implantation (e.g., for gettering) after depositing the USG layer. Accordingly, the method of this invention may enhance a gap-fill capability, a gettering capability, and electrical properties of a transistor.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A method of forming a pre-metal dielectric (PMD) layer, the method comprising:
   forming a nitride liner layer on a substrate containing a transistor;
   depositing an undoped silica glass (USG) layer on the nitride liner layer and then planarizing the USG layer;
   performing a first ion implantation and a first annealing in a first selected region of the USG layer; and
   performing a second ion implantation and a second annealing in a second selected region of the USG layer, wherein one of the first and second regions corresponds to a transistor gate region.

2. The method of claim 1, wherein the USG layer comprises O$_3$ tetraethyl orthosilicate (TEOS) or atomic layer deposition (ALD) TEOS.

3. The method of claim 1, further comprising:
   before depositing the USG layer, implanting fluorine ions into the nitride liner layer and heating.

4. The method of claim 1, wherein the first and second ion implantations for gettering use nitrogen ions, phosphorus ions, or arsenic ions.

5. The method of claim 1, wherein the first and second annealing comprises heating in a furnace for 10 minutes to 80 minutes at a temperature of 600° C. to 1200° C.

6. The method of claim 1, wherein the first and second annealing comprises rapid thermal annealing for 10 seconds to 80 seconds at a temperature of 600° C. to 1200° C.

7. The method of claim 1, wherein the USG layer comprises TEOS.

8. The method of claim 1, wherein one of the first and second regions consists essentially of a transistor gate region.

9. The method of claim 8, wherein the other of the first and second regions consists essentially of a non-gate region.

10. The method of claim 1, further comprising forming a mask substantially covering regions other than the transistor gate region.

11. The method of claim 1, further comprising forming a first mask substantially covering regions other than the transistor gate region before performing the ion implantation and annealing in the transistor gate region.

12. The method of claim 11, further comprising forming a second mask substantially covering the transistor gate region before performing the other ion implantation and annealing.

13. The method of claim 1, wherein the first and second ion implantations improves the gettering capability of the PMD layer.

14. The method of claim 13, wherein at least one of the first and second ion implantations further improves the reflow capability of the PMD layer.

15. The method of claim 1, wherein the ion implantation in the transistor gate region comprises implanting at least one first ion selected from the group consisting of nitrogen, phosphorous and arsenic.

16. The method of claim 13, wherein the other ion implantation comprises implanting at least one second ion selected from the group consisting of nitrogen, phosphorous and arsenic.

17. The method of claim 14, wherein at least one of the first and second ions further comprises boron.

18. The method of claim 14, wherein each of the first and second ions consist essentially of phosphorous.

* * * * *